United States Patent [19]

Tanttu

[11] Patent Number: 4,680,549
[45] Date of Patent: Jul. 14, 1987

[54] NMR COIL ARRANGEMENT
[75] Inventor: Jukka Tanttu, Espoo, Finland
[73] Assignee: Instrumentarium Corp., Finland
[21] Appl. No.: 690,303
[22] Filed: Jan. 10, 1985
[30] Foreign Application Priority Data
  Jan. 20, 1984 [FI] Finland .................................. 840232
[51] Int. Cl.⁴ ........................................... G01R 33/20
[52] U.S. Cl. .................... 324/318; 324/309;
                                                          324/322
[58] Field of Search ............... 324/307, 309, 318, 319,
                                    324/300, 322, 311; 128/653

[56]            References Cited
          U.S. PATENT DOCUMENTS

| 3,789,832 | 2/1974 | Danadian | 324/309 X |
|---|---|---|---|
| 3,932,805 | 1/1976 | Abe et al. | 324/309 |
| 4,051,429 | 9/1977 | Imanari et al. | 324/311 |
| 4,354,499 | 10/1982 | Danadian | 128/653 |
| 4,417,209 | 11/1983 | Hounsfield | 324/309 |
| 4,442,404 | 4/1984 | Bergmann | 324/309 |
| 4,543,959 | 10/1985 | Sepponen | 128/653 |
| 4,587,493 | 5/1986 | Sepponen | 324/319 |
| 4,617,936 | 10/1986 | Malko | 128/653 |
| 4,620,155 | 10/1986 | Edelstein | 324/322 |

FOREIGN PATENT DOCUMENTS 0187839  11/1983  Japan ..................... 128/653

OTHER PUBLICATIONS

E. Boskamp, Application of Surface Coils in MR Imaging, Medicamundi, vol. 29, No. 2, 1984, pp. 76.

Primary Examiner—Stewart J. Levy
Assistant Examiner—Scott M. Oldham
Attorney, Agent, or Firm—Andrus, Sceales, Starke & Sawall

[57]            ABSTRACT

The invention relates to a coil arrangement intended for an NMR testing apparatus for collecting NMR information about a target to be examined, said arrangement comprising first coil means (2) for exciting the nuclei of a target area and for receiving a signal emitted by the nuclei of a target area. The arrangement further includes second coil means (6) for gaining the amplitude of a signal emitted by a limited section of a target and connected to said first coil means, said gain being in proportion to the amplitude of a signal connecting from another section of a target. This is a way of improving the ratio of a signal connecting to said first coil means (2) from said limited section of a target to the electric noise created in the signal collection unit and in a target. The invention can be preferably applied to NMR imaging units which, in addition to mapping the entire body, can be used for the examination of smaller subdomains, such as the eye, ear, limbs etc.

13 Claims, 8 Drawing Figures

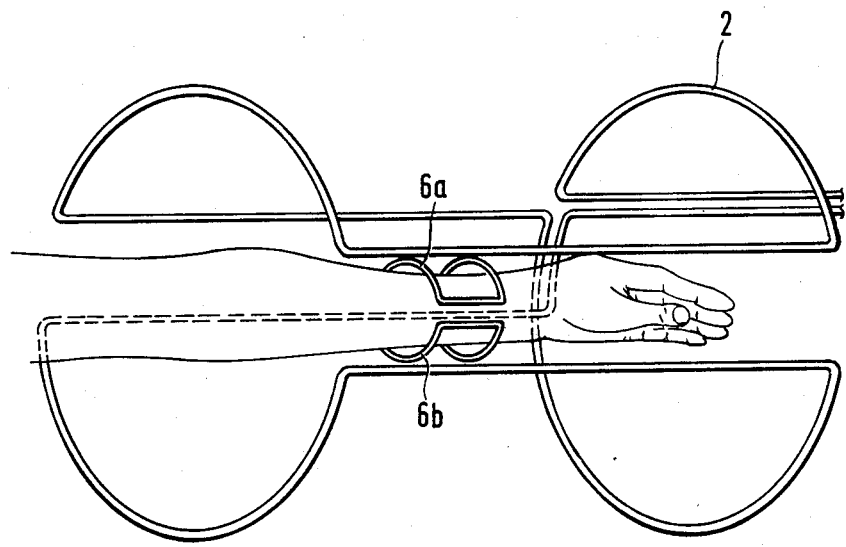

NMR COIL ARRANGEMENT

The present invention relates to an rf-coil arrangement for NMR examinations.

BACKGROUND OF THE INVENTION

Nuclear magnetic resonance (NMR=Nuclear Magnetic Resonance) is a phenomenon possessed by some atom nuclei and quite extensively used e.g. in the study of solid matter physics, chemistry and biology. The latest application of NMR is NMR imaging, the distribution of NMR parameters in an object to be examined (e.g. a human body) being presented as a map that can be used e.g. in medicine.

In NMR study, an rf-(=radio frequency) pulse is transmitted to a target in a static magnetic field, the frequency of said pulse being close to the so-called resonance frequency of the nucleus to be examined and its direction being substantially orthogonal relative to said static magnetic field. This pulse excites the desired nuclei making them precess around said static magnetic field. This precession induces in a receiver coil an NMR signal from which the desired parameters can be calculated.

An NMR examination apparatus is always provided with transmitter and receiver coils that can be separate or one single coil. In NMR imaging, the target to be examined is usually placed inside the receiver coil in an area where the rf field is as homogeneous as possible in order to accentuate all sections in the same way and to produce a reliable image.

However, the object of interest is often a small section of a larger target. Typical examples include the ophthalmic or otologic area in a human body, the outer layers of a body when measuring chemical shifts etc. Thus, it preferable to use a receiver coil which is sensitive to a signal originating from this particular section. Since the inducing signal is inversely proportional to the distance from the conductors of a receiver coil, this is accomplished by means of a small receiver coil that can be brought close to a target to be examined. This prior art solution, a so-called surface coil, can be used either as both transmitter and receiver or as a receiver only, in which case the excitation is effected by means of a larger transmitter coil producing a homogeneous rf-field.

A surface coil is most commonly used in an NMR imaging system intended for imaging also the entire body (or head). In this case, the introduction of a surface coil requires at least the following actions: (1) a surface coil must be connected to the receiving electronics of a system, (2) if the transmitter coil used is the transmitter/receiver coil of the actual system, the coupling thereof to the surface coil must be prevented for the signal detection period, (3) if the surface coil also serves as a transmitter, it must be connected to the transmitting electronics of the actual system (also in this case), the coupling to the transmitter/receiver coil of the actual system must be prevented).

The connection of a surface coil to the receiving electronics is generally effected in a manner that the surface coil is fitted with its own preamplifier and a signal is applied to the actual system at a later stage in the amplifier/mixer sequence. In this connection, the optimization of the noise characteristics of an apparatus demands rather high accuracy: blocking out external disturbances in quite crucial in NMR imaging. The transmitter and receiver coil arrangements nearly always involve the use of timed circuits. In the above-described case, between the surface coil and the transmitter/receiver coil of the actual system there is established a coupling which disturbs testing. In order to prevent the coupling, the surface coil can be set to be orthogonal relative to the actual coil (sensitive to movements), or the actual coil can be provided with a connection for cutting off the circuit for a signal receiving period.

SUMMARY OF THE INVENTION

The above aspects complicate the use of a surface coil in NMR imaging. An object of the invention is to provide a novel rf-coil arrangement which eliminates these difficulties and whose connection even to a complete NMR imaging apparatus is very simple. This system can be used for NMR imaging of e.g. the eye, ear or some other subdomain of a larger section, for measuring chemical shifts etc. The invention is not limited to typical surface coil cases only but a target to be examined can be completely or partly inside the coil (e.g. the arm).

These object are achieved by means of a coil arrangement set out in claim 1 which, in addition to the actual receiver coil, employs another set of coils that is electrically totally separate from the rest of the system and placed in the vicinity of a target to be examined.

DESCRIPTION OF THE DRAWINGS

The invention will now be described in more detail with reference made to the accompanying drawing, in which FIG. 5 shows one possible coil arrangement of the invention.

DESCRIPTION OF THE ILLUSTRATED EMBODIMENT

Figure 1:
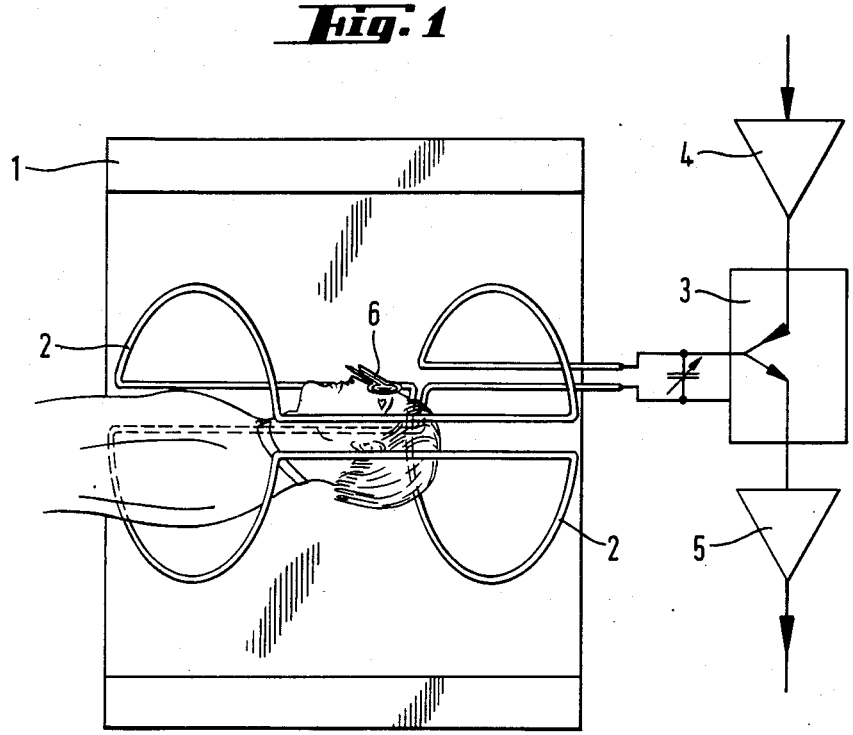
FIG. 1 shows a typical NMR imaging arrangement of the invention.

A coil arrangement of the invention can employ in transmitting and receiving the very same components as those in a normal or actual system. In FIG. 1, showing a typical arrangement of the invention, such components include a magnet 1, a transmitter/receiver coil 2, a matching circuit 3, an rf-power amplifier 4, a preamplifier 5. The only exception to a normal system is an auxiliary coil 6 and associated circuitry shown in FIG. 3, positioned in the immediate vicinity of a target to be examined (in this case the eye).

Figure 2A:
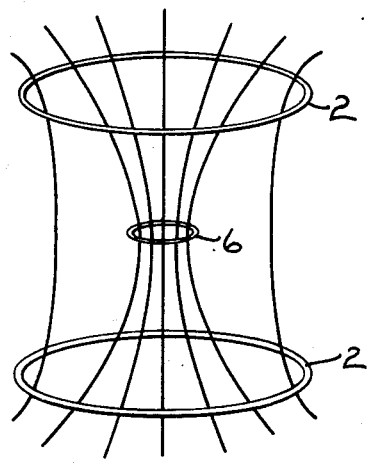
FIG. 2a illustrates in an arrangement of the invention, a field existing in a transmitter/receiver coil in the receiving mode and FIG. 2b in the transmitting mode.

The invention is based on the above-mentioned mutual coupling of two coils. This can be studied on the basis of what kind of an rf-field the receiver coil generates when inside it is placed an auxiliary coil tuned to the same frequency. This situation is outlined in FIG. 2a. The magnetic flux tends to work its way through the auxiliary coil, the more so the higher a quality factor Q possessed by said auxiliary coil, the magnetic flux density B being high near the auxiliary coil. On the basis of the reciprocal principle, an NMR signal inducing in the receiver coil will be $$e = -\frac{\partial}{\partial t}(\overline{B}_1 \cdot \overline{M}) \quad (1)$$

wherein $\overline{M}$ is the nuclear magnetization produced by precessing nuclei, $\overline{B}_1$ is the magnetic flux density produced in the target area by the receiver coil on a unit current and e is the electromotive force produced over the terminals of the receiver coil. Thus, in the case of FIG. 2a, an NMR signal originating from the vicinity of an auxiliary coil is stronger than what it would be without an auxiliary coil. If the receiver coil and auxiliary coil do not affect each other, $B_1$ and also signal e are amplified by Q-factor (Q=quality factor of auxiliary coil): in practice, this is not the case but amplification is lower and depends on the system geometry.

Figure 2B:
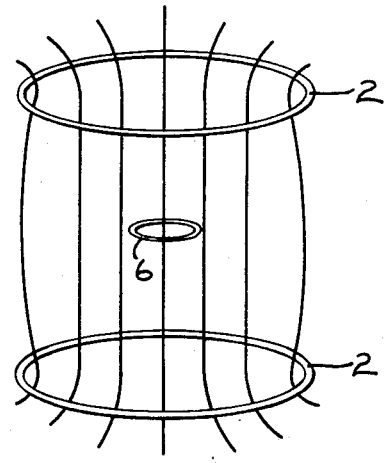
Figure 3A:
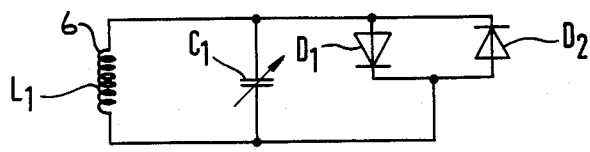
FIGS. 3a and 3b show various ways of reducing the disturbance of an rf-field during transmitting.
Figure 3B:
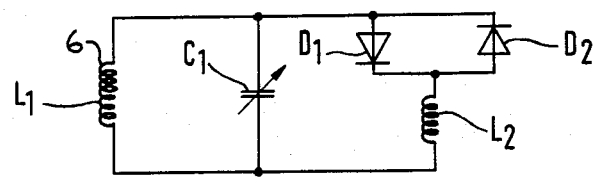

In order to eliminate the effect of an auxiliary coil on the rf-field during transmission, it is possible to connect oppositely poled diodes $D_1$ and $D_2$ parallel to an auxiliary coil 6, shown in FIG. 3a as $L_1$. In several NMR measuring sequences, the height of an rf-pulse is critical and then it is better to use a connection shown in FIG. 3b. During the transmission of an rf-pulse, there is induced in an auxiliary coil $L_1$ a voltage that is a lot higher than the junction voltage of diodes $D_1$ and $D_2$. Thus, a capacitor $C_1$ and coil $L_2$, whose inductance is equal to that of coil $L_1$, produce a parallel resonance circuit which from the ends of coil $L_1$ appears as a high impedance. Thus, a current passing in coil $L_1$ is low and does not have a substantial effect on the transmission field (FIG. 2b). An NMR signal is always much lower than the junction voltage of the diodes so, in this case, a parallel resonance circuit is established by coil $L_1$ and capacitor $C_1$. On the other hand, the effect of an auxiliary coil on the transmission field can also be used to an advantage. This is based on the fact that a suitably inhomogeneous transmission field can be used to only excite e.g. atom nuclei lying within a given limited area.

Figure 4A:
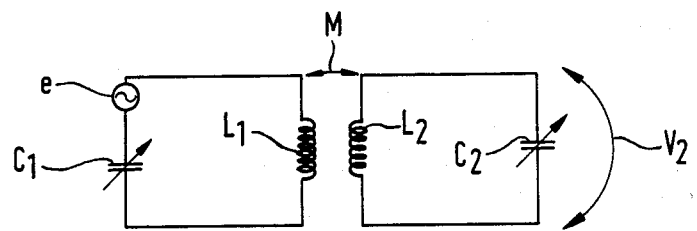
FIG. 4a shows an electric connection for an rf-coil arrangement of the invention and FIG. 4b an alternative connection.
Figure 4B:
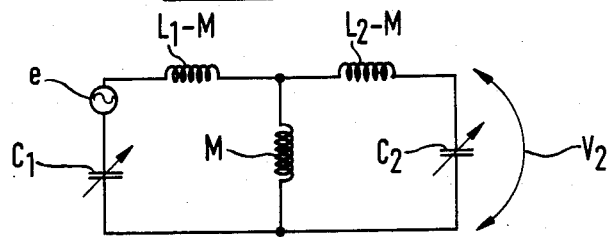

Referring to a coil arrangement of FIG. 4a which illustrates a relative or mutual connection between two resonance circuits. The mutual inductance of coil $L_1$, with quality factor $Q_1$, and coil $L_2$, with quality factor $Q_2$, will be $$M = k\sqrt{L_1 L_2} \quad (2)$$

wherein k is a coupling factor between the coils. Capacitors $C_1$ and $C_2$ make up parallel resonance circuits with coils $L_1$ and $L_2$. The electromotive force inducing in coil $L_1$ is e and frequency fo.

A voltage generating across capacitor $C_2$ reaches its maximum when $k^2 = 1/Q_1 \cdot Q_2$ and both resonance circuits are tuned to the same frequency fo, said voltage being $$V_2 \approx \frac{1}{2} \cdot \sqrt{Q_1 Q_2} \sqrt{\frac{L_2}{L_1}} \cdot e \quad (3)$$

Thus, when the coupling is low, an NMR signal inducing in the receiver coil is of the same order as a signal I V=$Q_1$ e, obtained by using a normal surface coil connection.

A similar study can also be applied to the case where just one of the circuits of FIG. 4a produces a resonance circuit. Also in this case, a signal induced in coil $L_1$ will be connected to coil $L_2$, if the system is otherwise in order.

The above circuit studies are not complete in terms of an NMR measuring but, instead, merely show a general principle. For example, they do not include the effect of the geometry of a radiofrequency magnetic field generated by the coils. This, in turn, depends in a highly complicated way on a measuring system. In addition, an essential quantity in NMR measuring is not the strength of a signal but, instead, the signal-to-noise ratio.

The invention is not limited to the use of just one auxiliary coil but there may be a number of those, either separate or different components of the same excitation circuit. For example in measurements or tests, where the size of a target varies, the connection to a fixed receiver coil can be improved by means of auxiliary coils.

FIG. 5 shows one such application. In addition to the transmitter/receiver coil 2 of an NMR measuring apparatus, the system includes other coil means. These coil means include two coils 6a and 6b, placed on either side of a target to be examined in a manner that an rf-field generated the same way as in FIG. 2 will be sufficiently homogeneous within an area to be examined. The target may be e.g. the arm, leg, head etc. The distance between the two coils may be changed to permit entry of the target and to optimize coupling of the signal.

What is claimed is:

1. A coil arrangement for an NMR apparatus for obtaining NMR data from a target to be examined, said arrangement comprising:
    first coil means (2) for exciting the nuclei of a target area by transmitting a radio frequency signal during a period of signal transmission and for receiving a signal emitted by the nuclei of the target area during a period of NMR signal detection; and
    second coil means (6) electrically unconnected from said first coil means but having a magnetic coupling to said first coil means, said second coil means being placed in the vicinity of a limited section of a target for enhancing the magnitude of a signal emitted by the limited section of the target, the signal enhancement obtained by said second coil means changing the relative contributions to the total received signal from the portions attributable to the limited and other sections of the target area in favor of the signal portion from said limited section.

2. A coil arrangement as set forth in claim 1 wherein said second coil means (6) includes resonance circuit means ($C_1$, $L_2$) capable of having a resonance frequency substantially the same as the frequency of said emitted signal from the limited section of the target.

3. A coil arrangement as set forth in claim 2 wherein said second coil means has a coil and wherein in order to reduce the effect of said second coil means on an rf field produced by said first coil means when exciting the nuclei, said resonant circuit means has electrical circuit means coupled to said coil for changing the resonance frequency of the second coil means existing during excitation from that existing during signal reception.

4. A coil arrangement as set forth in claim 3 wherein said resonance circuit means includes an impedance means ($C_1$; $L_2$) coupled to said coil, and current control means ($D_1$, $D_2$) coupled to said impedance means, said current control means being rendered conductive only after the voltage induced in said coil of the second coil means exceeds a predetermined value for providing a current path around or through said impedance means.

5. A coil arrangement as set forth in claim 4 wherein said current control means comprises parallel, oppositely poled diodes.

6. A coil arrangement as set forth in claim 4 wherein said impedance means is purely inductive and equal to the inductance of said coil of the second coil means.

7. A coil arrangement as set forth in claim 2 wherein said second coil means includes an electrical circuit means for cutting off said resonance circuit means for the period of signal transmission.

8. A coil arrangement as set forth in claim 2 wherein said second coil means is positioned electromagnetically orthogonal relative to a portion of said first coil means that causes excitation of the nuclei of the target.

9. A coil arrangement as set forth in claim 1 wherein said second coil means includes a plurality of coils forming separate components of a common circuit.

10. A coil arrangement as set forth in claim 9 wherein said second coil means includes two coils (*6a, 6b*) placed in the vicinity of different sections of a target to be examined in a manner such that the NMR signal received at first coil means from the different sections of the target is substantially homogeneous.

11. A coil arrangement as set forth in claim 10 wherein the spacing of the two coils forming portions of said second coil means is adjustable.

12. A coil arrangement as set forth in claim 1 wherein said first coil means comprises separate transmitter and receiver coils.

13. A coil arrangement as set forth in claim 1 wherein said first coil means includes a single coil serving both as a transmitter and a receiver coil.

* * * * *